(12) United States Patent
Chang et al.

(10) Patent No.: US 11,075,654 B2
(45) Date of Patent: Jul. 27, 2021

(54) METHOD AND ERROR CORRECTION SYSTEM FOR CORRECTING AN ERROR AT A UNIT POSITION OF A RECEIVED SIGNAL

(71) Applicant: I SHOU UNIVERSITY, Kaohsiung (TW)

(72) Inventors: Yao-Tsu Chang, Kaohsiung (TW); Chong-Dao Lee, Kaohsiung (TW)

(73) Assignee: I SHOU UNIVERSITY, Kaohsiung (TW)

( * ) Notice: Subject to any disclaimer, the term of this patent is extended or adjusted under 35 U.S.C. 154(b) by 0 days.

(21) Appl. No.: 16/870,732

(22) Filed: May 8, 2020

(65) Prior Publication Data
US 2020/0366318 A1    Nov. 19, 2020

(30) Foreign Application Priority Data
May 13, 2019    (TW) .................. 108116365

(51) Int. Cl.
*H03M 13/00*    (2006.01)
*H03M 13/29*    (2006.01)
*H03M 13/15*    (2006.01)

(52) U.S. Cl.
CPC ..... *H03M 13/2909* (2013.01); *H03M 13/157* (2013.01)

(58) Field of Classification Search
None
See application file for complete search history.

(56) References Cited

U.S. PATENT DOCUMENTS

| | | | |
|---|---|---|---|
| 9,954,553 B1* | 4/2018 | Langhammer | H03M 13/1575 |
| 2006/0200729 A1* | 9/2006 | Ito | G06F 11/1008 |
| | | | 714/763 |
| 2010/0169737 A1* | 7/2010 | Litsyn | H03M 13/6362 |
| | | | 714/752 |
| 2011/0214031 A1* | 9/2011 | Chang | H03M 13/1575 |
| | | | 714/755 |
| 2011/0276862 A1* | 11/2011 | Truong | H03M 13/153 |
| | | | 714/785 |
| 2016/0373134 A1* | 12/2016 | Langhammer | H03M 13/6572 |

* cited by examiner

*Primary Examiner* — Mujtaba M Chaudry
(74) *Attorney, Agent, or Firm* — DLA Piper LLP (US)

(57) ABSTRACT

A method for correcting an error of a received signal is provided. The method includes: determining a target degree based upon a length of the received signal; obtaining plural primitive polynomials each having a degree equal to the target degree; selecting one of the primitive polynomials as a target polynomial; defining plural syndromes according to the received signal; generating a group of product values based on the syndromes; obtaining plural coefficient polynomials based on the product values; obtaining monomial trace coefficients based on the coefficient polynomials; generating an error correction value based on the monomial trace coefficients; and correcting the error based on the error correction value.

10 Claims, 3 Drawing Sheets

METHOD AND ERROR CORRECTION SYSTEM FOR CORRECTING AN ERROR AT A UNIT POSITION OF A RECEIVED SIGNAL

CROSS-REFERENCE TO RELATED APPLICATION

This application claims priority of Taiwanese Invention Patent Application No. 108116365, filed on May 13, 2019.

FIELD

The disclosure relates to a method and an error correction system for correcting an error at a unit position of a received signal, and more particularly to a method and an error correction system for correcting an error at a unit position of a received signal utilizing monomial trace coefficients.

BACKGROUND

A signal transmitted from a transmitter to a receiver over a communication channel may be unwantedly modified because of interference, and thus the signal received by the receiver may have noise and may not be the same as the signal transmitted by the transmitter. Therefore, using a decoder to perform error correction on received signals would be necessary to enhance reliability of data transmission.

In U.S. Pat. No. 8,296,634 B2 (Error Correction Decoder, Error Correction Value Generator, and Error Correction System), an error correction value can be obtained by computing a summation of trace mapping values. However, each of the trace mapping values is computed via a trace polynomial which may have more than one non-zero terms and need adder(s) to implement the computation. The more the non-zero terms the trace polynomial has, the more complex the hardware of the decoder needs to be and the more energy the decoder consumes.

SUMMARY

Therefore, an object of the disclosure is to provide a method and an error correction system for correcting an error at a unit position of a received signal that can alleviate at least one of the drawbacks of the prior art.

According to one aspect of the disclosure, the method for correcting an error at a unit position of a received signal is provided, the received signal being generated based upon a generator polynomial having a plurality of roots. The method includes steps of: determining a target degree based upon a length of the received signal; obtaining a plurality of primitive polynomials each having a degree equal to the target degree; selecting one of the plurality of primitive polynomials as a target polynomial, roots of the target polynomial belonging to a Galois extension field of degree m, where the Galois extension field is an extension of Galois field, and m is the target degree; defining a plurality of syndromes according to the received signal, each of the syndromes being associated with a respective index; generating a group of product values based on the syndromes and the roots of the generator polynomial, each of the product values being represented $S_i \beta^{n-ij}$, where $S_i$ represents one of the syndrome associated with the index i, $\beta^i$ represents an $i^{th}$ one of the roots of the generator polynomial, n is the length of the received signal, and j represents the unit position of the received signal; for each of the product values, obtaining a coefficient polynomial $$a_j^i(\alpha) = \sum_{l=0}^{m-1} a_{jl}^i \alpha^l$$

based on the product value, where $\alpha^0$ to $\alpha^{m-1}$ form a basis set of the Galois extension field, and $a_{j0}^i$ to $a_{j(m-1)}^i$ belong to the Galois field; for each of the coefficient polynomials obtained respectively from the product values, obtaining a monomial trace coefficient based on the coefficient polynomial according to the target polynomial and a trace mapping equation $$Tr(\gamma) = \sum_{k=0}^{m-1} \gamma^{2^k},$$

wherein the monomial trace coefficient is calculated according to $Tr(a_j^i(\alpha)) = c_{ij}$, and $c_{ij}$ represents the monomial trace coefficient; generating an error correction value based on the monomial trace coefficients calculated respectively from the coefficient polynomials; and correcting the error at the unit position of the received signal based on the error correction value.

According to one aspect of the disclosure, the error correction system is configured to correct an error at a unit position of a received signal, where the received signal is generated based upon a generator polynomial having a plurality of roots.

The error correction system includes an error correction decoder and an error correcting device.

The error correction decoder includes a target polynomial generator, a syndrome generator, a monomial trace coefficient generator coupled to the target polynomial generator and the syndrome generator, and an error correction value generator.

The target polynomial generator is configured to determine a target degree based upon a length of the received signal, to obtain a plurality of primitive polynomials each having a degree equal to the target degree, and to select one of the plurality of primitive polynomials as a target polynomial. Roots of the target polynomial belong to a Galois extension field of degree m, where the Galois extension field is an extension of Galois field, and m is the target degree.

The syndrome generator is configured to define a plurality of syndromes according to the received signal. Each of the syndromes is associated with a respective index.

The monomial trace coefficient generator is configured to:
generate a group of product values based on the syndromes and the roots of the generator polynomial, each of the product values being represented by $S_i \beta^{n-ij}$, where $S_i$ represents one of the syndromes associated with the index i, $\beta^i$ represents an $i^{th}$ one of the roots of the generator polynomial, n is the length of the received signal, and j represents the unit position of the received signal;
for each of the product values, obtain a coefficient polynomial $$a_j^i(\alpha) = \sum_{l=0}^{m-1} a_{jl}^i \alpha^l$$

based on the product value, where $\alpha^0$ to $\alpha^{m-1}$ form a basis set of the Galois extension field, and $\alpha_{j0}{}^i$ to $\alpha_{j(m-1)}{}^i$ belong to the Galois field; and for each of the coefficient polynomials obtained respectively from the product values, obtain a monomial trace coefficient based on the coefficient polynomial according to the target polynomial and a trace mapping equation $$Tr(\gamma) = \sum_{k=0}^{m-1} \gamma^{2^k},$$

wherein the monomial trace coefficients are calculated according to $Tr(\alpha_j{}^i(\alpha))=c_{ij}$, and $c_{ij}$ represents the monomial trace coefficients.

The error correction value generator is coupled to the monomial trace coefficient generator, and is configured to generate an error correction value based on the monomial trace coefficients calculated respectively from the coefficient polynomials.

The error correcting device is coupled to the error correction value generator, and is configured to correct the error at the unit position of the received signal based on the error correction value.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
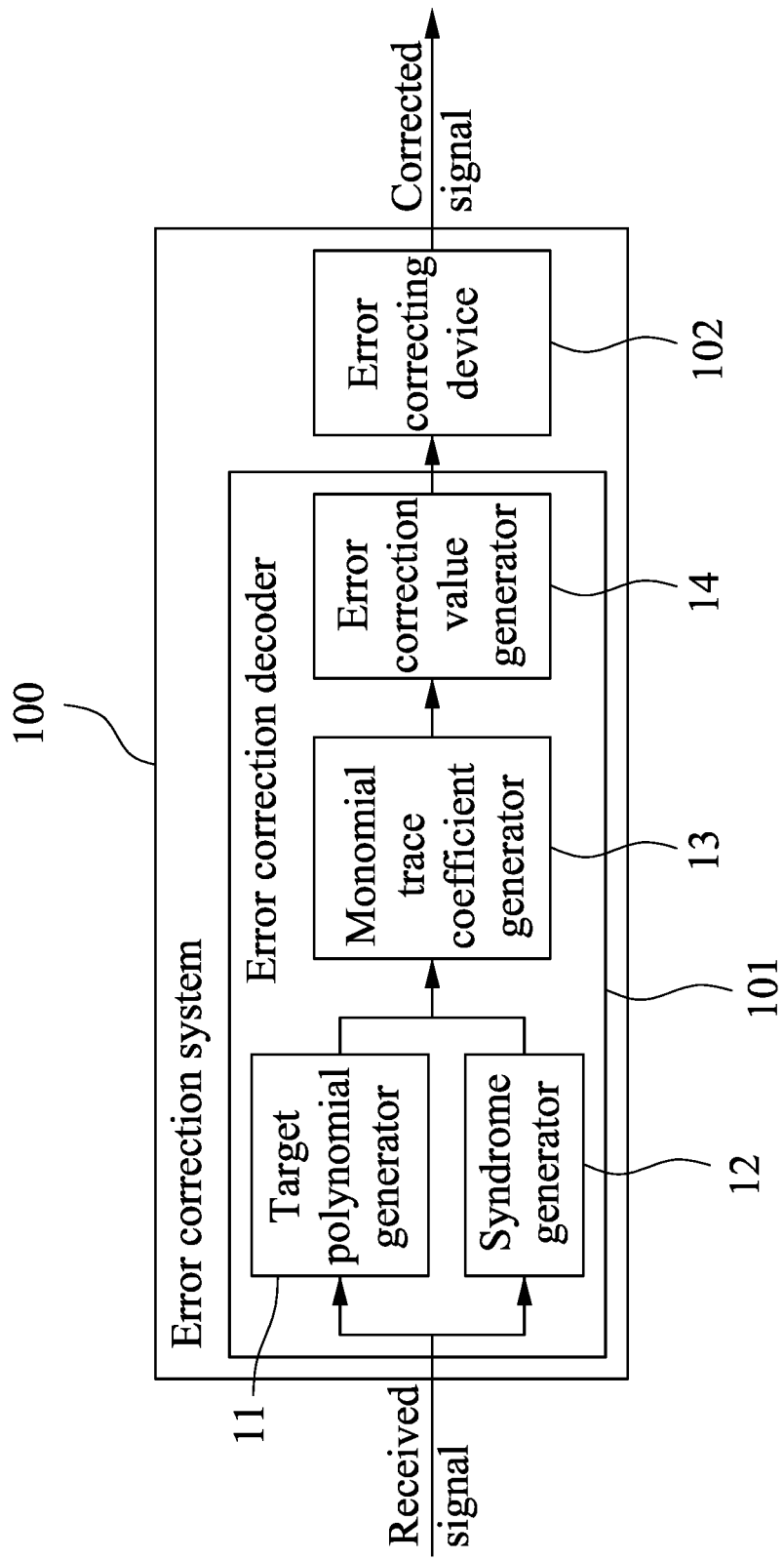
FIG. 1 is a block diagram illustrating an embodiment of an error correction system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, an embodiment of an error correction system 100 according to this disclosure is configured to correct an error of a received signal. The error correction system 100 includes an error correction decoder 101 and an error correcting device 102 coupled to the error correction decoder 101.

A source signal is encoded based upon a generator polynomial g(x) to generate a cyclic codeword. Then, the cyclic codeword is transmitted to the error correction system 100 via a transmission channel, where interference might occurred, to result in a signal with a length n received by the error correction system 100 (hereinafter referred to as the "received signal"). The cyclic codeword can be expressed as a codeword polynomial $$c(x) = \sum_{j=0}^{m-1} c_j x^j,$$

where j is a variable representing a unit position of the received signal, $j \in \{0,1,\ldots,n-1\}$, and $(c_0, c_1, \ldots, c_{n-1})$ denotes an associated code vector. Errors of the received signal attributed to the interference can be expressed as an error polynomial $$e(x) = \sum_{j=0}^{n-1} e_j x^j.$$

Therefore, the received signal can be expressed as $$r(x) = \sum_{j=0}^{n-1} r_j x^j = c(x) + e(x). \quad (1)$$

The error correction decoder 101 includes a target polynomial generator 11, a syndrome generator 12, a monomial trace coefficient generator 13 coupled to the target polynomial generator 11 and the syndrome generator 12, and an error correction value generator 14 coupled to the monomial trace coefficient generator 13.

Figure 2:
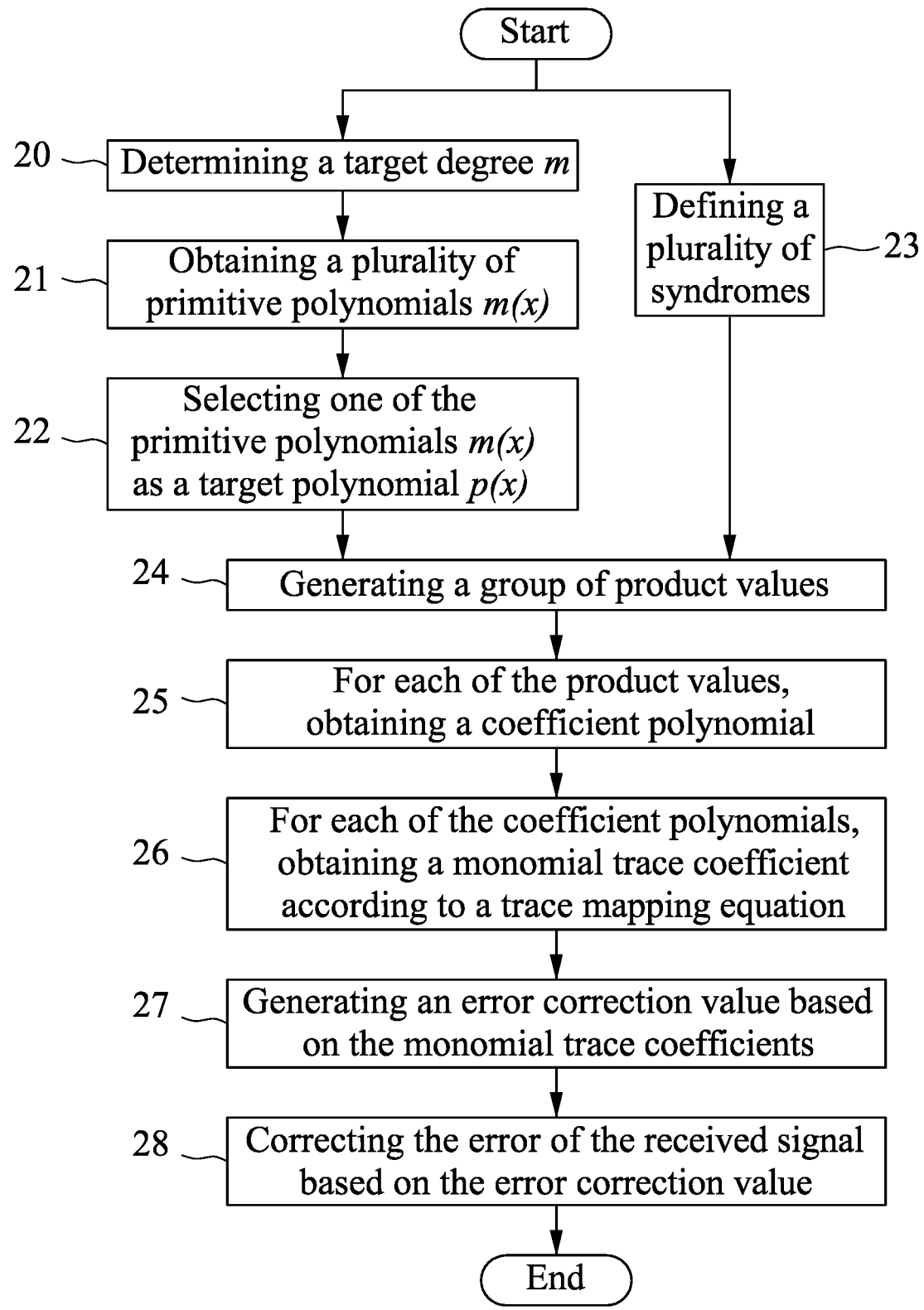
FIG. 2 is a flow diagram illustrating an embodiment of a method for correcting an error at a unit position of a received signal according to the disclosure.

Further referring to FIG. 2, a method for correcting an error at a unit position of a received signal is implemented by the error correction system 100 according to an embodiment of this disclosure. It should be noted that, for the received signal, there could be more than one unit position with an error to be corrected, but the following description is, for the sake of simplicity, illustrated with examples of correcting one error at one specific unit position of the received signal r(x). In the following description, the symbol j is a constant representing the specific unit position.

In step 20, the target polynomial generator 11 determines a target degree m based upon the length n of the received signal. Specifically, the target degree m is determined by selecting a smallest value that satisfies an equation of $(2^m-1) \bmod n = 0$.

In step 21, the target polynomial generator 11 obtains a plurality of primitive polynomials m(x) based on the target degree m. Each of the primitive polynomials m(x) is irreducible and has a degree equal to the target degree m. For example, the following table lists the primitive polynomials m(x) for when the target degree m is 3, 4, or 5.

TABLE 1

| m | primitive polynomials m(x) |
|---|---|
| 3 | $(x^3 + x^2 + 1)$, $(x^3 + x + 1)$ |
| 4 | $(x^4 + x^3 + x^2 + x + 1)$, $(x^4 + x^3 + 1)$, $(x^4 + x + 1)$ |
| 5 | $(x^5 + x^4 + x^3 + x^2 + 1)$, $(x^5 + x^4 + x^3 + x + 1)$, $(x^5 + x^4 + x^2 + x + 1)$, $(x^5 + x^3 + x^2 + x + 1)$, $(x^5 + x^3 + 1)$, $(x^5 + x^2 + 1)$ |

In step 22, the target polynomial generator 11 further selects one of the plurality of primitive polynomials m(x) as a target polynomial p(x), where roots of the target polynomial p(x) belong to a Galois extension field $GF(2^m)$ of degree m, and the Galois extension field $GF(2^m)$ is an extension of Galois field GF(2).

Figure 3:
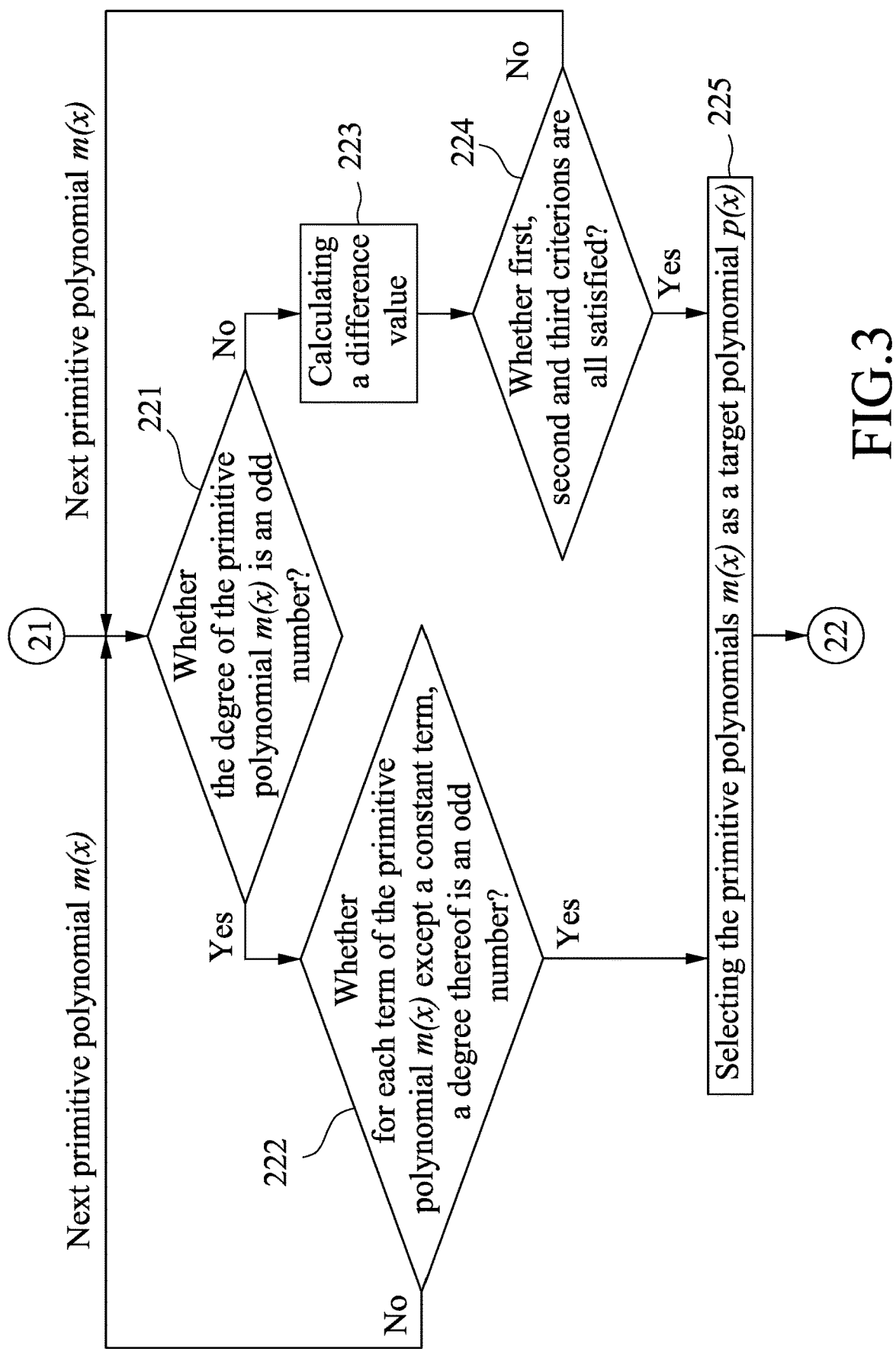
FIG. 3 is a flow diagram illustrating sub-steps of a step of selecting a target polynomial of the method illustrated in FIG. 2.

In detail, step 22 includes sub-steps 221-225 to be iteratively performed for one or more of the primitive polynomials m(x) until the target polynomial p(x) is found, as shown in FIG. 3.

First, the target polynomial generator 11 determines whether the degree of the primitive polynomial m(x) is an odd number (sub-step 221).

When it is determined that the degree of the primitive polynomial m(x) is an odd number, the target polynomial generator 11 determines whether for each term of the primitive polynomial m(x) except a constant term, a degree thereof is an odd number (sub-step 222).

When it is determined that all terms other than the constant term have an odd-number degree, the target polynomial generator 11 selects the primitive polynomial m(x) as the target polynomial p(x) (sub-step 225).

For example, when the target degree m is determined to be "3" in step 20, the primitive polynomials m(x) are found to be $(x^3+x^2+1)$ and $(x^3+x+1)$ in step 21, accordingly. Then, in step 221, it is determined that for each of the primitive polynomials $(x^3+x^2+1)$ and $(x^3+x+1)$, the degree of the primitive polynomial (i.e., three) is an odd number. The terms of the primitive polynomial $(x^3+x^2+1)$ other than the constant term have degrees of 3 and 2, while the terms of the primitive polynomials $(x^3+x+1)$ other than the constant term have degrees of 3 and 1. Therefore, only the primitive polynomial $(x^3+x+1)$ is determined, in sub-step 222, to have odd-degree terms only, except a constant term. Therefore, the primitive polynomial $(x^3+x+1)$ is selected as the target polynomial p(x) in sub-step 225.

On the other hand, when it is determined, in sub-step 221, that the degree of the primitive polynomial m(x) is not an odd number, the target polynomial generator 11 calculates a difference value u by subtracting a highest odd degree of terms of the primitive polynomial m(x) from the target degree m (sub-step 223). Then, the target polynomial generator 11 determines whether the following first to third criterions are all satisfied (sub-step 224).

The first criterion is that the difference value u is greater than or equal to one half of the target degree m. The second criterion is that a number of those terms of the primitive polynomial m(x), the degree of each of which is an even number and is greater than the difference value u, is equal to a number of those terms of the primitive polynomial m(x) that have odd degrees. The third criterion is that, for each term of the primitive polynomial m(x) that has an odd degree, the primitive polynomial m(x) has a non-zero term having a degree that is equal to a sum of the odd degree and the difference value u.

When the first, second and third criterions are all satisfied, the target polynomial generator 11 selects the primitive polynomial m(x) as the target polynomial p(x) (sub-step 225).

For example, when the target degree m is determined to be "4" in step 20, the primitive polynomials m(x) are found, in step 21, to be $(x^4+x^3+x^2+x+1)$, $(x^4+x^3+1)$ and $(x^4+x+1)$, accordingly. For each of these three primitive polynomials, the degree thereof is determined to be not an odd number in sub-step 221, and the corresponding difference value u thereof is calculated in sub-step 223. Specifically, the difference value is equal to one (i.e., u=1) for the primitive polynomial $(x^4+x^3+x^2+x+1)$ or $(x^4+x^3+1)$, and is equal to three (i.e., u=3) for the primitive polynomial $(x^4+x+1)$. In sub-step 224, it is found that only the primitive polynomial $(x^4+x+1)$ satisfies all the first, second and third criterions.

In detail, the difference value u corresponding to the primitive polynomial $(x^4+x+1)$ is greater than one half of the target degree (that is u=3, m=4, and u>m/2). That is to say, the primitive polynomial $(x^4+x+1)$ satisfies the first criterion.

As for the second criterion, the primitive polynomial $(x^4+x+1)$ has only one term $x^4$ having an even degree that is greater than the difference value u, and only one term x having an odd degree. That is to say, the number of those terms of the primitive polynomial $(x^4+x+1)$, the degree of each of which is an even number and is greater than the difference value u is one, and is equal to the number of those terms of the primitive polynomial $(x^4+x+1)$ that have odd degrees. Accordingly, the primitive polynomial $(x^4+x+1)$ satisfies the second criterion.

Regarding the third criterion, for each term of the primitive polynomial $(x^4+x+1)$ that has an odd degree (term x with degree of one), the primitive polynomial $(x^4+x+1)$ has a non-zero term $x^4$ having a degree of four that is equal to a sum of the degree of the term x (one) and the difference value u (three). That is to say, the primitive polynomial $(x^4+x+1)$ satisfies the third criterion.

Thus, the primitive polynomial $(x^4+x+1)$ is selected as the target polynomial p(x) in sub-step 225.

Back to FIGS. 1 and 2, in step 23, the syndrome generator 12 defines a plurality of syndromes according to the received signal, where the syndrome $S_i$ is associated with an $i^{th}$ index. Specifically, the index i corresponding to each of multiple representative elements belongs to a set R of all representative elements of a cyclotomic coset $C_i$ of i modulo n, i.e., i∈R. Particularly, the cyclotomic coset $C_i$ is defined by $C_i=\{i\cdot 2^k|k=0,1,\ldots,d-1\}$, where d is a minimum positive integer satisfying $i\cdot 2^d \equiv i(\bmod\ n)$. Since methods for generating the syndromes are known to those skilled in the art (see, for example, "Algebraic Decoding of (71, 36, 11), (79, 40, 15) and (97, 49, 15) Quadratic Residue Codes," *IEEE Transactions on Communications*, Vol. 51, No. 9, pages 1463-1473, September 2003, and "Algebraic Decoding of (103, 52, 19) and (113, 57, 15) Quadratic Residue Codes," *IEEE Transactions on Communications*, Vol. 53, No. 5, pages 749-754, May 2005), details thereof will be omitted herein for the sake of brevity.

In step 24, the monomial trace coefficient generator 13 generates a group of product values based on the syndromes and the roots of the generator polynomial g(x), wherein each of the product values is represented by $S_i \beta^{n-ij}$, where $S_i$ represents the syndrome associated with the index i, and $\beta^i$ represents an $i^{th}$ roots of the generator polynomial g(x).

In step 25, for each of the product values, the monomial trace coefficient generator 13 obtains a coefficient polynomial $$a_j^i(\alpha) = \sum_{l=0}^{m-1} a_{jl}^i \alpha^l$$

based on the product value $S_i \beta^{n-ij}$, that is $$a_j^i(\alpha) = S_i \beta^{n-ij} = \sum_{l=0}^{m-1} a_{jl}^i \alpha^l, \qquad (2)$$

where $\alpha^0$ to $\alpha^{m-1}$ form a basis set of the Galois extension field $GF(2^m)$, and $\alpha_{j0}^i$ to $\alpha_{j(m-1)}^i$ belong to the Galois field GF(2).

In step 26, for each of the coefficient polynomials, the monomial trace coefficient generator 13 obtains a monomial trace coefficient $c_{ij}$ based on the coefficient polynomial according to a trace mapping equation $$Tr(\gamma) = \sum_{k=0}^{m-1} \gamma^{2^k}, \qquad (3)$$

wherein the monomial trace coefficient $c_{ij}$ is calculated according to $$Tr(\alpha_j^i(\alpha)) = c_{ij}, \qquad (4)$$

i.e. let $\gamma = \alpha_j^i(\alpha)$, $i \in R$.

In step 27, the error correction value generator 14 generates an error correction value $e_j$ based on the monomial trace coefficients. Specifically, the error correction value $e_j$ is calculated based on $$e_j = S_0 + \sum_{i \in R} c_{ij}, \qquad (5)$$

where $S_0$ represents the syndrome with the index i=0.

In step 28, the error correcting device 102 corrects the error at the specific unit position j of the received signal based on the error correction value.

For example, in the case of m=3, the primitive polynomial ($x^3+x+1$) would be selected as the target polynomial p(x) as previously described.

According to Equation (3) and $\gamma = \alpha_j^i(\alpha)$, each monomial trace coefficient can be obtained as $$c_{ij} = Tr(\gamma) = \sum_{k=0}^{3-1} \gamma^{2^k} = \gamma + \gamma^2 + \gamma^4 = (a_j^i(\alpha)) + (a_j^i(\alpha))^2 + (a_j^i(\alpha))^4, \qquad (6)$$

where $$a_j^i(\alpha) = \sum_{l=0}^{m-1} a_{jl}^i \alpha^l = a_{j0}^i + a_{j1}^i \alpha + a_{j2}^i \alpha^2.$$

By using XOR operators (not shown) to perform addition operations, three equations $x^3=x+1$, $x^4=x+x^2$ and $x^8=x$ can be obtained from the target polynomial $p(x)=x^3+x+1=0$. Then, Equation (6) is simplified by substituting $\alpha^3=\alpha+1$, $\alpha^4=\alpha+\alpha^2$ and $\alpha^8=\alpha$ into Equation (6). As a result, the monomial trace coefficients $c_{ij}=\alpha_{j0}^i$ are obtained, $i \in R$. The error correction value can be calculated accordingly, and is expressed by $$e_j = S_0 + \sum_{i \in R} c_{ij} = S_0 + a_{j0}^1 + a_{j0}^3.$$

It should be noted that, without selecting the target polynomial p(x) according to this disclosure, there would be no guarantee that a monomial trace coefficient $c_{ij}$ would be obtained. For example, in the case of m=3, if the primitive polynomial ($x^3+x^2+1$), rather than the primitive polynomial ($x^3+x+1$), is selected for the subsequent calculation, we will get $\alpha^3=\alpha^2+1$, $\alpha^4=1+\alpha+\alpha^2$, and $\alpha^8=\alpha$ for substituting into the equation of $c_{ij}$. Then, we can get the monomial trace coefficient $c_{ij}=\alpha_{j0}^i+\alpha_{j1}^i+\alpha_{j2}^i$. Accordingly, the error correction value is calculated as $$e_j = S_0 + \sum_{i \in R} c_{ij} = S_0 + a_{j0}^1 + a_{j1}^1 + a_{j2}^1 + a_{j0}^3 + a_{j1}^3 + a_{j2}^3.$$

There will therefore be the need to provide four additional adders, and the hardware of the error correction decoder 101 would be relatively more complicated.

From the above, hardware of the error correction decoder 101 can be simplified because the target polynomial is selected properly according to this disclosure.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for correcting an error at a unit position of a received signal, the received signal being generated based upon a generator polynomial having a plurality of roots, said method comprising steps of:

determining a target degree based upon a length of the received signal;

obtaining a plurality of primitive polynomials each having a degree equal to the target degree;

selecting one of the plurality of primitive polynomials as a target polynomial, roots of the target polynomial belonging to a Galois extension field of degree m, where the Galois extension field is an extension of Galois field, and m is the target degree;

defining a plurality of syndromes according to the received signal, each of the syndromes being associated with a respective index;

generating a group of product values based on the syndromes and the roots of the generator polynomial, each of the product values being represented by $S_i\beta^{n-ij}$, where $S_i$ represents one of the syndromes associated with the index i, $\beta_i$ represents an $i^{th}$ one of the roots of the generator polynomial, n is the length of the received signal, and j represents the unit position of the received signal;

for each of the product values, obtaining a coefficient polynomial $$a_j^i(\alpha) = \sum_{l=0}^{m-1} a_{jl}^i \alpha^l$$

based on the product value, where $\alpha^0$ to $\alpha^{m-1}$ form a basis set of the Galois extension field, and $\alpha_{j0}^i$ to $\alpha_{j(m-1)}^i$ belong to the Galois field;

for each of the coefficient polynomials obtained respectively from the product values, obtaining a monomial trace coefficient based on the coefficient polynomial according to the target polynomial and a trace mapping equation $$Tr(\gamma) = \sum_{k=0}^{m-1} \gamma^{2^k},$$

wherein the monomial trace coefficient is calculated according to $Tr(\alpha_j^i(\alpha)) = c_{ij}$, and $c_{ij}$ represents the monomial trace coefficient;

generating an error correction value based on the monomial trace coefficients calculated respectively from the coefficient polynomials; and correcting the error at the unit position of the received signal based on the error correction value.

2. The method as claimed in claim 1, wherein the step of determining the target degree is to select a smallest value that satisfies an equation of $(2^m-1) \bmod n = 0$ as the target degree.

3. The method as claimed in claim 1, wherein the step of selecting one of the primitive polynomials as the target polynomial includes sub-steps of, for each of at least one of the primitive polynomials:

determining whether the degree of the primitive polynomial is an odd number;

when it is determined that the degree of the primitive polynomial is an odd number, determining whether for each term of the primitive polynomial except a constant term, a degree thereof is an odd number; and when it is determined that for each term of the primitive polynomial except the constant term, the degree is an odd number, selecting the primitive polynomial as the target polynomial.

4. The method as claimed in claim 1, wherein the step of selecting one of the primitive polynomials as the target polynomial includes sub-steps of, for each of at least one of the primitive polynomials:

determining whether the degree of the primitive polynomial is an odd number;

when it is determined that the degree of the primitive polynomial is not an odd number, calculating a difference value by subtracting a highest odd degree of terms of the primitive polynomial from the target degree;

determining whether a first criterion that the difference value is greater than or equal to one half of the target degree, a second criterion that a number of those terms of the primitive polynomial, the degree of each of which is an even number and is greater than the difference value, is equal to a number of those terms of the primitive polynomial that have odd degrees, and a third criterion that, for each term of the primitive polynomial that has an odd degree, the primitive polynomial has a non-zero term having a degree that is equal to a sum of the odd degree and the difference value are all satisfied; and when the first, second and third criterions are all satisfied, selecting the primitive polynomial as the target polynomial.

5. The method as claimed in claim 1, wherein the step of generating the error correction value is to calculate the error correction value based on $$e_j = S_0 + \sum_{i \in R} c_{ij},$$

where $e_j$ represents the error correction value.

6. An error correction system configured to correct an error at a unit position of a received signal, the received signal being generated based upon a generator polynomial having a plurality of roots, said error correction system comprising:

an error correction decoder including a target polynomial generator configured to determine a target degree based upon a length of the received signal, to obtain a plurality of primitive polynomials each having a degree equal to the target degree, and to select one of the plurality of primitive polynomials as a target polynomial, roots of the target polynomial belonging to a Galois extension field of degree m, where the Galois extension field is an extension of Galois field, and m is the target degree, a syndrome generator configured to define a plurality of syndromes according to the received signal, each of the syndromes being associated with a respective index, a monomial trace coefficient generator coupled to said target polynomial generator and said syndrome generator, and configured to generate a group of product values based on the syndromes and the roots of the generator polynomial, each of the product values being represented by $S_i \beta^{n-ij}$, where $S_i$ represents one of the syndromes associated with the index i, $\beta_i$ represents an $i^{th}$ one of the roots of the generator polynomial, n is the length of the received signal, and j represents the unit position of the received signal, for each of the product values, obtain a coefficient polynomial $$a_j^i(\alpha) = \sum_{l=0}^{m-1} a_{jl}^i \alpha^l$$

based on the product value, where $\alpha^0$ to $\alpha^{m-1}$ form a basis set of the Galois extension field, and $\alpha_{j0}^i$ to $\alpha_{j(m-1)}^i$ belong to the Galois field, and for each of the coefficient polynomials obtained respectively from the product values, obtain a monomial trace coefficient based on the coefficient polynomial according to the target polynomial and a trace mapping equation $$Tr(\gamma) = \sum_{k=0}^{m-1} \gamma^{2^k},$$

wherein the monomial trace coefficient is calculated according to $\mathrm{Tr}(\alpha_j^i(\alpha))=c_{ij}$, and $c_{ij}$ represents the monomial trace coefficient, and an error correction value generator coupled to said monomial trace coefficient generator, and configured to generate an error correction value based on the monomial trace coefficients calculated respectively from the coefficient polynomials; and an error correcting device coupled to said error correction value generator, and configured to correct the error at the unit position of the received signal based on the error correction value.

7. The error correction system as claimed in claim 6, wherein said target polynomial generator is configured to select a smallest value that satisfies an equation of $(2^m-1)$ mod n=0 as the target degree.

8. The error correction system as claimed in claim 6, wherein said target polynomial generator is configured to select one of the primitive polynomials as the target polynomial by, for each of the primitive polynomials:

determining whether the degree of the primitive polynomial is an odd number;

when it is determined that the degree of the primitive polynomial is an odd number, determining whether for each term of the primitive polynomial except a constant term, a degree thereof is an odd number; and when it is determined that for each term of the primitive polynomial except the constant term, the degree thereof is an odd number, selecting the primitive polynomial as the target polynomial.

9. The error correction system as claimed in claim 6, wherein said target polynomial generator is configured to select one of the primitive polynomials as the target polynomial by, for each of the primitive polynomials:

determining whether the degree of the primitive polynomial is an odd number;

when it is determined that the degree of the primitive polynomial is not an odd number, calculating a difference value by subtracting a highest odd degree of terms of the primitive polynomial by the target degree;

determining whether a first criterion that the difference value is greater than or equal to one half of the target degree, a second criterion that a number of those terms of the primitive polynomial, the degree of each of which is an even number and is greater than the difference value, is equal to a number of those terms of the primitive polynomial that have odd degrees, and a third criterion that, for each term of the primitive polynomial that has an odd degree, the primitive polynomial has a non-zero term having a degree that is equal to a sum of the odd degree and the difference value are all satisfied; and when the first, second and third criterions are all satisfied, selecting the primitive polynomial as the target polynomial.

10. The error correction system as claimed in claim 6, wherein said error correction value generator is configured to calculate the error correction value based on $$e_j = S_0 + \sum_{i \in R} c_{ij},$$

where $e_j$ represents the error correction value.

* * * * *